United States Patent [19]

Thomas et al.

[11] 4,160,272
[45] Jul. 3, 1979

[54] DIGITAL VOLTAGE ACCUMULATOR

[75] Inventors: Frank J. Thomas, Wellesley Hills, Mass.; Donald L. Gay, Daytona Beach; Chester A. Winsor, Orlando, both of Fla.

[73] Assignee: Martin Marietta Corporation, Orlando, Fla.

[21] Appl. No.: 867,214

[22] Filed: Jan. 5, 1978

[51] Int. Cl.² ............................................. G06J 1/00
[52] U.S. Cl. .......................... 364/602; 235/92 EV; 235/92 SA; 358/125; 364/516; 364/770
[58] Field of Search ............... 364/600, 602, 607, 768, 364/769, 770, 833, 118, 111, 516; 328/151; 235/92 CP, 92 SA, 92 EV; 358/125, 126; 250/203 CT, 215

[56] References Cited

U.S. PATENT DOCUMENTS

| | | | |
|---|---|---|---|
| 3,462,588 | 8/1969 | Hussey | 364/600 |
| 3,673,392 | 6/1972 | Holm | 364/602 X |
| 3,831,016 | 8/1974 | Nathan | 364/607 |
| 4,001,555 | 1/1977 | Levis et al. | 364/602 |
| 4,007,357 | 2/1977 | Yanagishima | 235/92 EV |

Primary Examiner—Joseph F. Ruggiero
Attorney, Agent, or Firm—Julian C. Renfro; Gay Chin

[57] ABSTRACT

A digital voltage accumulator functioning to store a digital signal over an extended period of time, the digital signal representing the accumulated sum of values of an analog input signal as sampled during the period of time following system reset command. The accumulator is capable of selectively incrementing or decrementing the stored signal, following an update command, in response to amplitude and polarity changes in the analog input signal. Signal storage is effected using a digital counter and a bipolar digital to analog converter. The analog equivalent to the stored digital signal is arithmetically summed with the analog input signal. Update is accomplished by comparing this summed signal with the analog equivalent of the stored digital signal upon command. The digital counter increments when the sum signal is positive relative to the stored signal and decrements when the sum signal is negative relative to the stored signal. The update cycle stops when the comparator senses that the stored digital signal equals the arithmetic sum of the analog input signal plus the old value of the stored digital signal.

12 Claims, 6 Drawing Figures

DIGITAL VOLTAGE ACCUMULATOR

BACKGROUND OF THE INVENTION

A signal storage device capable of providing stable long term hold characteristics has important applications to control systems. In a closed loop system, for example, error signals are produced signifying the offsets of the closed loop system from a reference position. The reference position may be defined as the desired position of the system and thus, the error signals will be reduced to zero if the system achieves this reference position. In many cases, if the error signals corresponding to these offsets can be accumulated and stored without drift due to temperature, etc., the required time between adjustments or offset nulling can be greatly increased.

It is known that feedback control loops are often constrained to generate a maximum instantaneous error signal during each processing cycle notwithstanding the fact that the actual system offset from its reference position in terms of a true error signal is greater that the maximum error signal which can be generated by the feedback control loop due to limited instantaneous dynamic range. The reasons for this limitation to the maximum instantaneous error signal are various and a discussion of these reasons is not necessary for a full understanding of the invention described hereinafter. It is sufficient to understand that the limitation does exist. With an actual error greater than the maximum instantaneous error signal which can be generated during a processing cycle, the system reference point can never be reached during a single processing cycle. If the system offset from its reference position is not caused to increase by reason of any external influence, such as the physical movement of the system being controlled, the system can achieve zero error over several processing cycles. However, if the system offset increases due to external causes while maximum instantaneous error signals are being generated, the reference point may never be reached. Due to these instantaneous limitations on the error signals a means of increasing the total effective dynamic range with little or no drift is highly desirable.

The problems resulting from the limitation on the maximum available instantaneous error signal may be more fully appreciated by referring to the following example. Air to ground missile systems allow an aircraft to fire an on-board missile to a designated target with great accuracy using sophisticated electronic equipment to guide the missile to the target. In one such system, known as a laser designator system, a laser beam is directed from the aircraft to the target along the target line-of-sight from the aircraft. The missile is caused to lock onto the beam and follow it to the target. For the system to function properly, the laser beam must be accurately positioned along the target to aircraft line-of-sight. Target trackers are used for this purpose.

A target tracker is a device which views the surrounding geography and functions to cause the designated target to be located at the center of the operating field of view of the target tracking sensor. For the purposes of the application, a TV tracker will be assumed, although other types of trackers, including infra-red trackers as well as laser spot trackers may also be considered. A TV tracker consists primarily of an electrooptic sensor, such as a vidicon, which views the scene within its operating field of view and generates video signals corresponding to the scene, a video processor and an error processor.

In conventional TV systems, the video signal is transmitted to a remote location and reconverted into an optical signal viewed on a suitable monitor. In a TV tracker system, the video signal is not only used to generate a view of the scene on a cockpit mounted monitor, but is also used to discriminate a suitable target within its operating field of view and cause the tracker to automatically acquire and track this target such that the target is aligned with the center of the sensor field of view and target lock-on or track is established. The tracker sensor is then properly aligned along the line-of-sight from the aircraft to the target. During the procedure, the laser beam, which has been boresighted with the TV sensor line-of-sight, follows the target movement so that it too is properly aligned with the target line-of-sight.

To effect the above described tracker operation, the tracker is provided with a video processor and an error processor. The video processor functions, generally, to condition sensor generated video signals to effectively isolate the target from the background video and to generate video signals representing target location within the sensor field of view. The video processor generated signals are applied to the error processor which generates the error signals representing the misalignment between the target location and the center of the sensor field of view. These error signals are applied to system servos which function to reposition the tracker in a direction tending to null the error signals.

As an aircraft is continuously in motion relative to a stationary or moving target, continuous repositioning of the target tracker is necessary in order to maintain the tracker line-of-sight coincident with the target to aircraft line-of-sight. However, if the maximum error signal per processing cycle is less than the actual error, the increasing error attributable to aircraft movement may outpace the error signal controlled servo movement resulting in eventual loss of lock.

A technique for effectively increasing the rate at which the tracker moves toward its reference position involves the accumulation of error signals over successive processing cycles. By accumulating the maximum error signals over successive processing cycles, a signal representing the true error is approached allowing the servos to quickly reposition toward the reference point. Previous signal accumulators used for this purpose have been analog devices. Such devices use, for example, capacitors which preclude accurate long term signal storage because such devices are susceptible to signal drift over several processing cycles. The digital accumulator of the present invention has application to such an error processor and allows error signal accumulation in a bipolar direction over several processing cycles without signal drift.

The accumulator of the present invention has application to other systems besides target trackers. Indeed, it has application to any system which requires long term signal storage with stored signal modification capability. Another system which may make use of the accumulator to which the invention pertains is an autoboresight system such as described in the co-pending patent application of Thomas and Beauregard entitled "Automatic Laser Boresighting", Ser. No. 872,196, filed Jan. 25, 1978, and assigned to the same assignee as the instant invention. The co-pending application describes an automatic laser boresighting system for automatically boresighting the laser of a laser designator system to the null point of an automatic television tracker by selectively causing the laser beam to be retroreflected to the tracker electro-optic sensor which interfaces with the television tracker video processor. The tracker locks onto the retroreflected laser spot, with the tracker error signals, in a feedback control loop, being used to control the sensor raster bias to center the sensor sweeps about the laser spot, thereby nulling the tracker error signals and achieving boresight with the laser automatically.

These are but two examples of the use of our inventive device. Various other uses will become apparent to those skilled in the art after gaining a full understanding of the invention by reading the detailed description set out hereinafter.

SUMMARY OF THE INVENTION

It is an object of the present invention to provide a signal accumulating and storage device which is essentially immune from signal drift.

It is a further object of the invention to provide a signal accumulating and storage device immune from drift, and capable of either incrementing or decrementing the stored signal to effect bipolar operation of the device.

It is also an object of the invention to construct such an accumulator to be responsive to bipolar analog signals.

It is a still further object of the invention to accomplish the foregoing objects with digital techniques making use of digital storage circuits virtually immune from signal drift.

These and other objects as will become apparent from the description of the invention described in detail hereinafter are accomplished through the use of the accumulator device of the present invention which includes a digital up-down counter for signal storage. The stored signal is selectively incremented or decremented in response to a count-up signal to the count-up input terminal of the counter and a count-down signal to the counter's count-down input terminal, respectively. The count-up and count-down signals are generated by an analog comparator producing either a logic high or a logic low signal depending upon the relative levels of two inputs thereto. The comparator output is connected to the counter through gating circuits. The output of one gating circuit is connected to the count-up input of the counter while the output of the other gating circuit is connected to the count-down input. Only one of the gating circuits is enabled at any point in time, with the enabling of the gating circuits being controlled from the output of the comparator. The enabled gating circuits transmit clock signals from a system clock causing the counter to count up or down.

One input to the comparator is the analog equivalent to the stored digital signal arithmetically summed with the analog input signal. This input signal may be an error signal as described hereinbefore. However, any other analog input signal may be used in that the invention herein is not limited to an error signal generating system. A second input to the comparator is the analog equivalent to the stored signal. A logic high issues from the comparator so long as the sum signal input is positive relative to the accumulator stored signal. This logic high causes the counter to count up, increasing the value of the stored signal. A logic low issues from the comparator when the sum signal is negative relative to the accumulator stored signal, which logic low controls the counter to decrement.

When the digital accumulator is used in a tracker system, the stored signal is read out of the accumulator as an analog signal through the operation of a digital to analog converter and applied as an input signal to the system servos. The stored count in the counter is maintained between processing cycles and is modified in response to variations in the accumulator input signal. During subsequent processing cycles the changing analog input signal is summed with the accumulator stored signal and compared with this stored signal to generate new comparator outputs. The accumulator design allows the input signals thereto to be either of a positive or negative polarity. An analog input of negative polarity causes the signal at the negative input terminal to the comparator to be greater than the signal at its positive terminal resulting in a logic low at the comparator output. This causes the counter to count down, thus decreasing the value of the signal stored in the accumulator. A positive input when added to the stored signal and compared with the stored signal results in a logic high comparator output and a corresponding incrementing of the counter. In either case the change in the accumulator storage counters is completed when the analog comparator changes state from its initial condition at the beginning of the processing cycle. The logic used to accomplish this is described in the detailed description which follows.

DETAILED DESCRIPTION OF A PREFERRED EMBODIMENT

Figure 1:
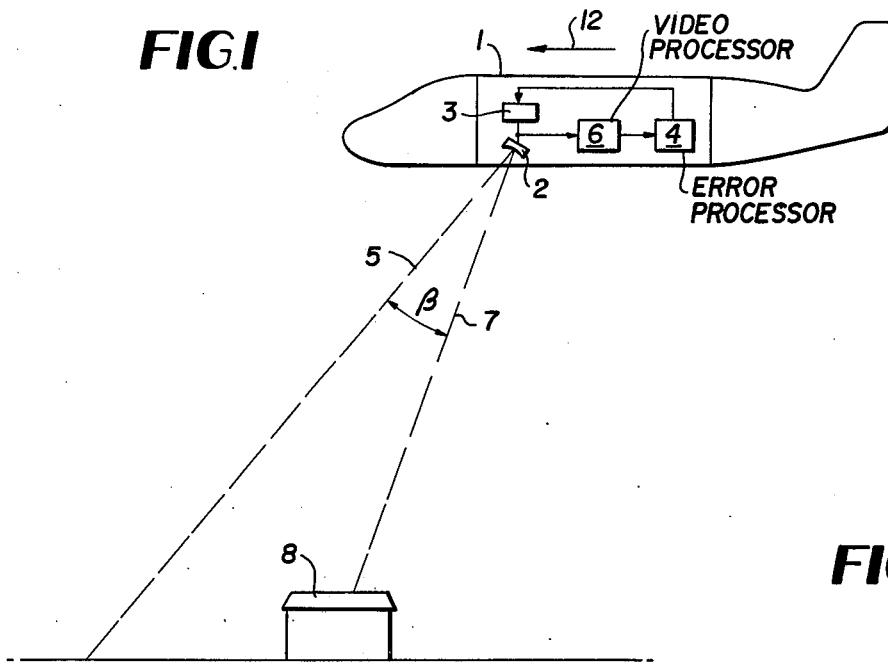
FIG. 1 illustrates the basic components of a target tracker system which will benefit by the use of this invention.

Signal accumulation and subsequent stable long term storage of the accumulated signals is often necessary in position control equipment. As discussed hereinabove, such signal accumulators find application in target tracking apparatus. FIG. 1 illustrates a target tracking system which may make use of the present invention. The elements within block 1 form the basic elements of a tracker system which for purposes of explaining the invention will be assumed to be a TV tracker. As will be clear from the ensuing explanation, the invention is not limited to use with a TV tracker system and indeed has application to many other systems besides trackers.

Figure 2:
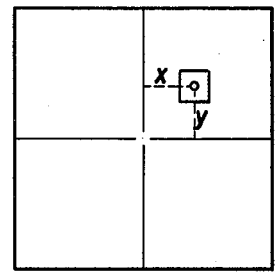
FIG. 2 illustrates the video display of a TV camera of a target tracker system at the instant in which an undesirable offset exists between the tracker line of sight and the target line of sight.

Assuming a TV tracker system, a vidicon or other electrooptic sensor 2 is mounted on a servo positioning control platform 3. The platform position is controlled in response to error signals issued from the error processor 4 receiving its input from the video processor 6. Such a system is well known in the art and does not per se form a portion of the present invention. Also shown in FIG. 1 is an assumed target 8 with the tracker sensor line of sight 5 offset from the target to aircraft line of sight 7 by angle $\beta$. The angle $\beta$ offset may be translated to a Y direction offset from the center point of the sensor field of view as illustrated in FIG. 2. The x offset from the center point results from a line of sight error of an angle in the X direction not shown in FIG. 1. It is necessary that suitable platform repositioning occur in response to error signals from the error processor to cause the tracker, relative to the FIG. 2 situation, to effectively move up in the vertical direction a distance y and to the right in the horizontal direction a distance x. By reason of the inherent error processor operating limitations, the maximum error signal which can be generated during any processing cycle may be substantially less than the actual error. For example, if it be assumed that the distance y is 2.5% of the operating field of view and the maximum error signal which can be generated during a processing cycle is 1.5% of the field of view, an error of 1.0% of the field of view goes unaccounted for during a particular cycle. In that the aircraft continues to move in the direction indicated by the arrow 12 of FIG. 1, the line of sight residual error continues to increase dynamically during subsequent attempts to reduce the error to zero with a subsequent increase in the angular hangoff. It has been determined that this line of sight residual error may be reduced if the error signals produced by the error processor are accumulated over successive processing cycles. Previous devices to accumulate error signals included analog memories which use capacitors as the storage medium. However, those storage devices were found unacceptable due to drift problems attributable to charge leakage from the capacitors. The circuit of the present invention resulted from attempts to design a circuit which could accumulate a signal, such as error signals generated by conventional target trackers, and hold these signals over substantial lengths of time without decay, while permitting bipolar signal modification of the stored signal, following an update command.

Figure 3:
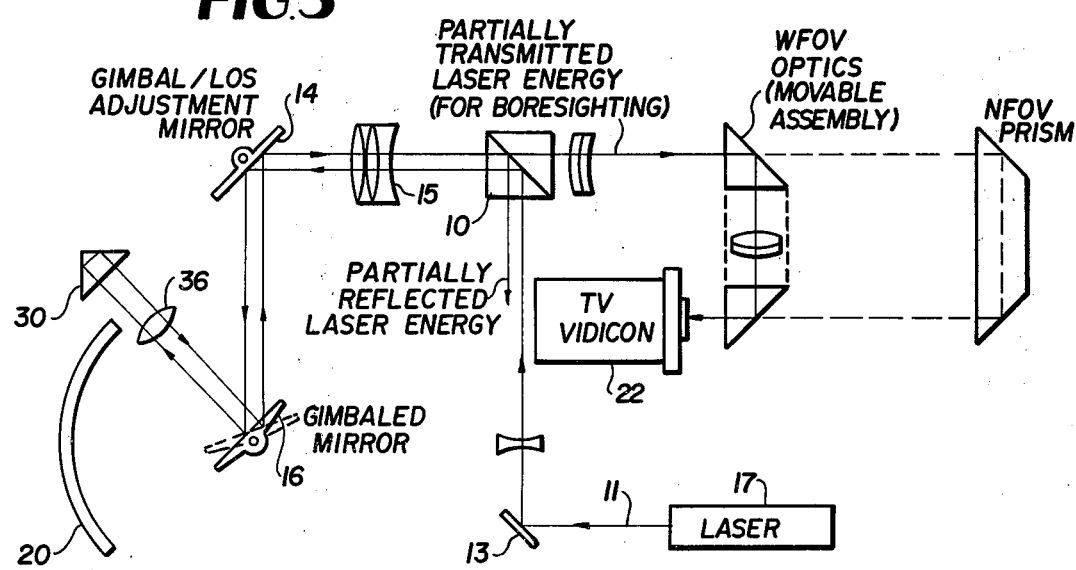
FIG. 3 is a diagrammatic representation of the principal components of a laser designator system modified to allow automatic laser boresighting to the center of the video sensor operating field of view, which boresighting system will benefit from this invention.

The need for a signal accumulator which is capable of storing an accumulated signal over extended periods of time while permitting stored signal modification, upon command, was reinforced when the boresighting problem as described in the aforementioned co-pending application was encountered. FIG. 3 is a block diagram of the boresight control system. Reference should be made to the above mentioned co-pending application for a complete description of the autoboresighting system, and its teachings are to be regarded as incorporated by reference herein. However, in order to explain the application of the present invention to the solution of the autoboresighting problem, a brief description of the autoboresighting control system will now be provided herein.

Figure 4:
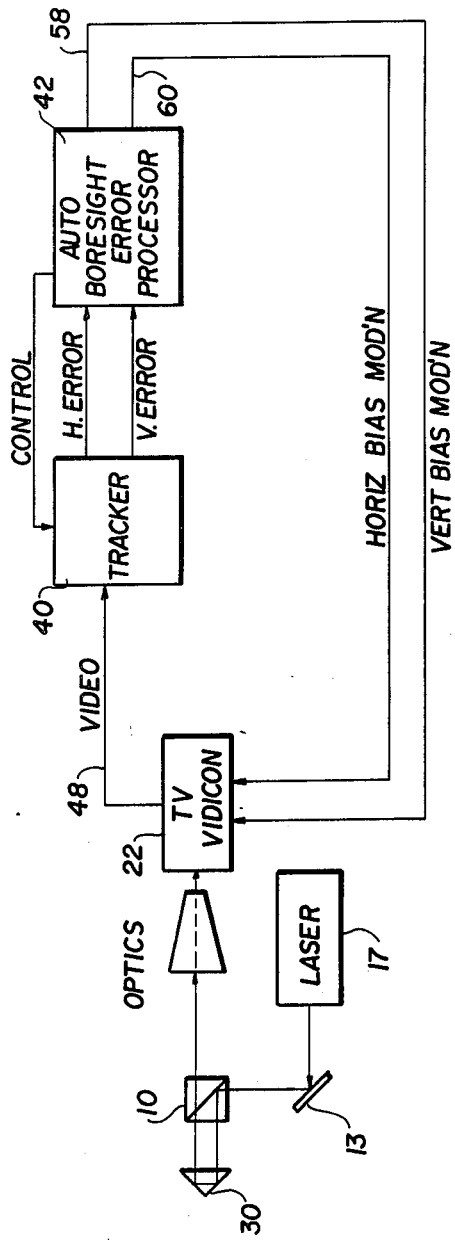
FIG. 4 is a functional block diagram depicting the principal components involved in a laser designator system modified to permit automatic laser boresighting.

To accomplish boresighting of the laser beam 11 to the center of the operating field of view of the tracker sensor, the boresight mode is initiated when the laser signal is retroreflected to the sensor 22 through suitable optics including a mirror 13, dichroic prism 10, lens 15, sight adjustment mirror 14, gimbaled mirror 16, lens 36 and corner cube 30. This causes the laser beam 11 from the laser generator 17 to be retroreflected to the screen of the vidicon 22. Normally, during other than the boresight mode, laser 11 exits the system through dome 20. As shown in FIG. 4, a tracker 40 receives the video signals from the camera 22 over line 48 to generate horizontal and vertical error signals representing the offset of the laser spot from the center of the operating field of view of the camera sensor. These error signals are inputed to an autoboresight error processor 42 where the digital accumulator of the present invention finds particular application. The error processor 42 functions to produce vertical bias modification signals and horizontal bias modification signals on lines 58 and 60 which function to modify the vidicon raster scan electronically, causing the center of the vidicon field of view to coincide with the laser spot. The bias modification signals must be retained without decay until a subsequent autoboresighting sequence. While various storage means may be used to maintain the bias modification signals, the particular store used must be able to accurately maintain the stored signals between autoboresight cycles and also be able to alter the stored signal in response to changed error signals. It is in such a system that the present invention also has special value.

It is to be understood, however, that the digital accumulator of the present invention is not limited to the two above described applications but has general applicability to any system which requires signal storage and modification of the stored signal in response to varying input signals, upon command.

Figure 5:
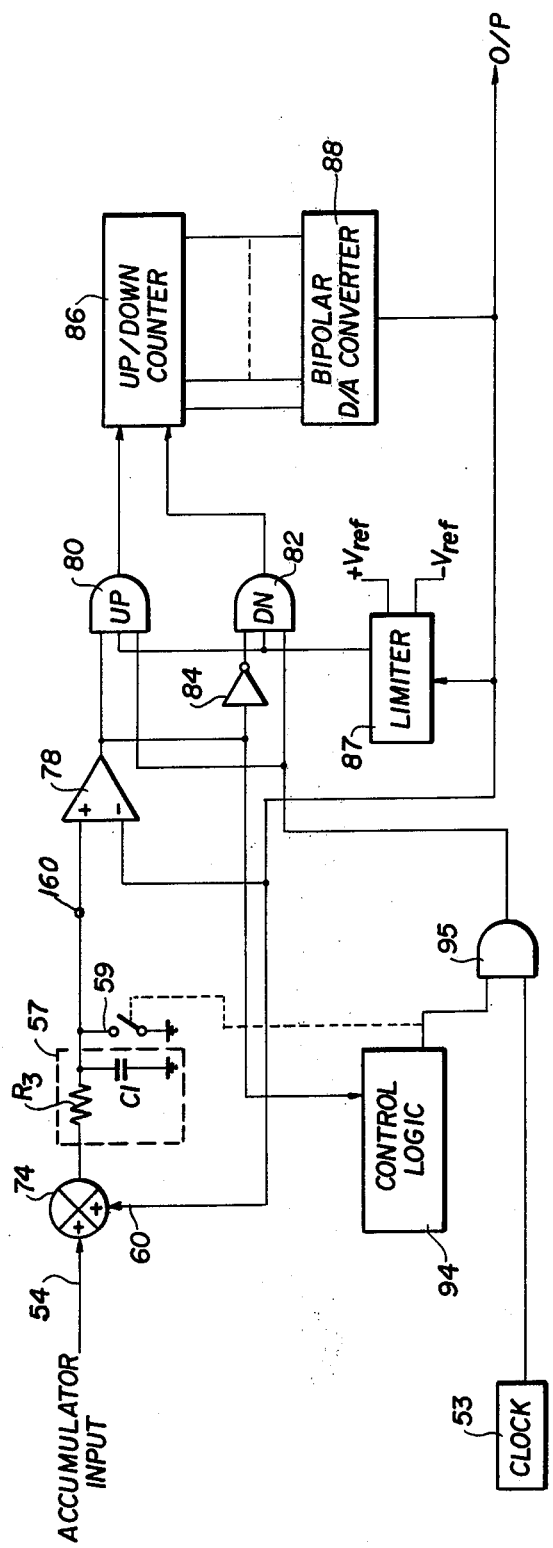
FIG. 5 is a functional block diagram of the digital voltage accumulator of this invention.

FIG. 5 is a block diagram of the accumulator of the present invention. The accumulator input signal is received on input line 54. When used in a target tracker or an autoboresight system, line 54 would receive a tracker error signal representing either the horizontal or vertical signal error. As indicated more fully in said co-pending application, the autoboresighting system would use two accumulator devices, one for the horizontal error signals and one for the vertical error signals. Similarly, tracker systems would also use two accumulators, one for vertical error signals and one for horizontal error signals. Input line 54 is connected to one input of a summer 74. The analog equivalent of the digital signal stored in the accumulator is applied by means of lead 60 to the other input of the summer 74. The summer 74 is a conventional analog summing amplifier, such as an operational amplifier. The summed signal resulting from the action of the summer 74 is applied to an up-down counter 86 in a manner to be hereinater described.

The output from the summer 74 appears as the arithmetical sum of the accumulator input signal from line 54 and the signals previously stored by means of the accumulator storage. The output from the summer 74 is connected to comparator 78 through a filter 57. Switch 59 operates to selectively discharge the capacitor C1. The operation of filter 57 and switch 59 will be described in detail with respect to FIG. 6. In the perferred embodiment, the storage means includes the counter 86 of FIG. 5. This summed signal is applied to the positive input of the comparator 78. The negative input to the comparator 78 is the accumulator stored signal on line 60. Directional control gates 80 and 82 receive the output from the comparator 78, with gate 82 receiving the comparator output through the inverter 84. The outputs of gates 80 and 82 are applied to the up-down counter 86 which serves to accumulate and hold a digital word representative of the summed input signal to the comparator. The enabling inputs to the gates 80 and 82 are derived from the output of control gate 95, the inputs to gate 95 being a clock signal from clock 53, and the output from control logic 94, which will be explained in greater detail hereinbelow with reference to FIG. 6. A limiter 87 is preferably provided to disable the counter 86 from further counting after it reaches full count to prevent counter overflow/underflow. The limiter is connected between line 60 and gates 80 and 82. The operation of limiter 87 will be described in detail with respect to FIG. 6.

When the input signal on line 160 is of a value more positive than the signal on line 60 the output from the comparator 78 achieves a logic high which, in the presence of an enabling signal from the output of a control gate 95, causes the counter 86 to begin increasing its stored count. On the other hand, when the input signal on line 160 goes more negative that the signal on line 60 the output of the comparator 78 will be at a logic low, which logic low is applied to the control gate 82 as a logic high through the operation of inverter 84. When gate 82 is enabled, the counter 86 is caused to count down.

The digital count in up-down counter 86 converted in a well-known manner into an analog signal through the operation of the bipolar digital to analog converter 88.

Figure 6:
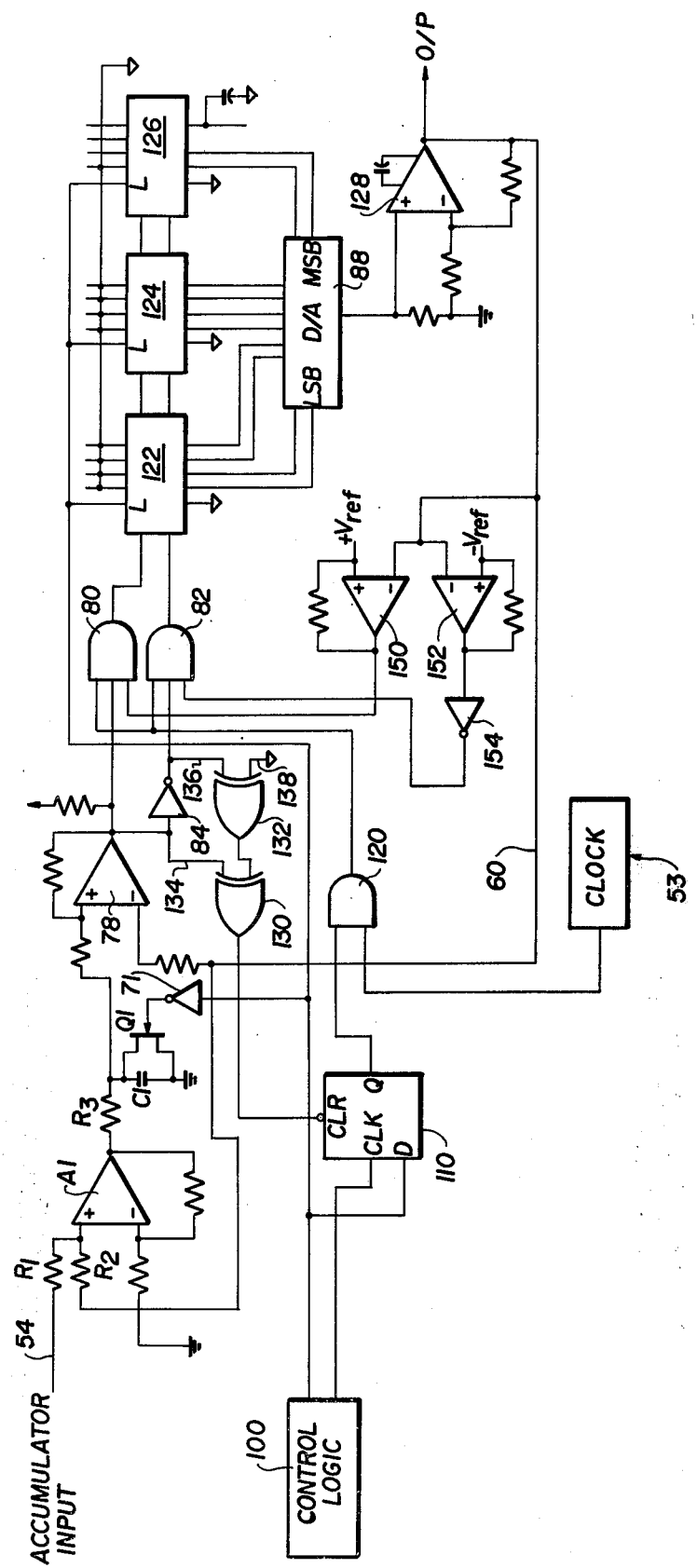
FIG. 6 is a schematic of the digital voltage accumulator of the invention.

FIG. 6 repesents a schematic diagram of the digital accumulator of the present invention.

With regard to the components in FIG. 6 corresponding to the summer 74 of FIG. 5, these involve resistors R1 and R2 and amplifier A1 with the accumulator input on lead 54 being applied to resistor R1, and the stored accumulator signal on lead 60 being applied to resistor R2. The summing point is of course at the node between these two resistors and the summed signal is received at the positive input of comparator 78 via the RC filter comprised of resistor R3 and capacitor C1.

The negative input to the comparator 78 in FIG. 6 is the stored accumulator signal and this signal is the analog equivalent of the digital count stored in the counters 122, 124 and 126, which counters correspond to counter 86 in FIG. 5. As previously explained, the digital count is converted into an analog signal through the operation of the digital to analog converter 88, whose output is applied to the positive terminal of amplifier 128 and it is the output of the amplifier 128 that is provided to lead 60.

The state of comparator 78 determines, as previously mentioned, the direction the counter chain 122, 124 and 126 counts, but the counting can of course only take place in the presence of clock pulses to the control gates 80 and 82 when the flip-flop 110, which forms a portion of control logic 94 illustrated in FIG. 5, functioning in a manner to be hereinafter described, has been SET. The control logic 100 in FIG. 6, when combined with flip-flop 110 and exclusive OR gates 130 and 132 make up the control logic 94 of FIG. 5. In FIG. 6, these principal control elements 110, 130 and 132 within control logic 94 have been illustrated external to control logic 94 so as to detail some of the elements within block 94. If the output from the comparator 78 is at a logic high, indicating that the signal from amplifier A1 at its positive terminal is greater than the signal at its negative terminal, the counter chain will count up whereas if the output of the comparator 78 is at a logic low, indicating that the signal at its negative terminal is greater, the counter chain will count down.

As will be explained in greater detail, the counting sequence is terminated when a logic signal of proper polarity is generated to reset the flip-flop 110. This logic signal is generated when the output of the comparator changes thereby signifying that the input signal to the digital accumulator has reached the arithmetic sum of the analog input signal plus the old value of the stored digital signal. The logic signal which resets the flip-flop 110 is of a time duration equal to the propagation delay of exclusive OR gates 130, 132 and inverter 84. It should, therefore, be noted that the flip-flop 110 functions as a critical logic control block with regard to the respective updating of the signal stored in the accumulator in that such flip-flop must be placed in the SET condition in order to allow the counting chain to count up or down to bring about an appropriate change in the stored signal.

There are two ways by which flip-flop 110 may be reset and a description of these two ways now follows.

When the output of comparator 78 is at a logic high, which is the circumstance in which the signal from the amplifier A1 is greater than the signal stored in the counter, the input 134 to exclusive OR gate 130 is also at a logic high. At this point, the input 136 to gate 132 is at a logic low due to the action of the inverter 84. With input 138 maintained at a logic low, the output of gate 132 is at a logic low resulting in a logic high output from gate 130. At this point, flip-flop 110 remains in the previously established SET condition. When the negative input to comparator 78 becomes greater than the value of the signal at its positive input, a logic low at the output of the comparator will result. This will bring about a logic low at output of gate 130 for a time duration equivalent to the propagation delay of inverter 84, plus the propagation delay of exclusive OR gates 132 and 130. During this logic low, the flip-flop 110 will be RESET, thereby disabling control gate 95 and subsequently disabling control gates 80 and 82 which prevent the counters 122, 124 and 126 from counting any further.

Alternatively, should the positive input to comparator 78 be less than the value of the signal at its negative input, a logic low at the output of the comparator will exist, the output from exclusive OR gate 132 will be at a logic high resulting once again in a logic high at the output of the gate 130. As the counter chain counts down, the negative input to comparator 78 will become less than the signal at its positive input, causing comparator 78 to change states from a logic low to a logic high which will result in a logic high at both inputs to gate 130, causing a logic low at its output. This logic low will last for a duration equal to the propagation delay fo inverter 84 and exclusive OR gates 130, 132. This logic low at the clear input to flip-flop 110 will again reset the flip-flop. With flip-flop 110 RESET, control gate 95 is disabled, disabling control gates 80, 82 to prevent the counters 122, 124 and 126 from counting any further. Thus, a change of state of comparator 78 from a low to a high or vice versa effects a RESET condition of flip-flop 110.

It should be noted that resistor R3 and capacitor C1 are used to provide a smoothing action on the output of amplifier A1 as well as a short-term memory of the input analog voltage. Transistor Q1 is an FET switch used to discharge the voltage across C1 when control logic 100 initializes the accumulator to zero by loading the proper logic states into counters 122, 124 and 126 upon command to initiate another accumulation cycle. The inverter 71 functions to render Q1 conductive between cycles thereby discharging C1. On the initiation of a counting cycle, initiated in response to a logic high control signal from control logic 100 to the D input of flip-flop 110, in which the stored signal will be changed in accordance with the value of the input signal to the accumulator, transistor Q1 is rendered non-conductive allowing C1 to charge to the input analog voltage. When the control signal assumes a logic low at the end of a cycle, Q1 is rendered conductive and C1 discharges thereby setting the voltage across it to zero volts at the time that the counters 122, 124 and 126 are loaded to their preprogrammed value.

The control logic 100 provides control functions for initiating the counting cycles during which the count in the counter 86 is modified in accordance with changes in the accumulator input signal. The actual implementation of the control logic depends to a great degree upon the ultimate use of the accumulator. For example, in the autoboresightings system, described in the aforementioned co-pending application, the control logic synchronizes the laser fire command pulses to the camera vertical blanking signals, provides the autoboresight control signal to the TV tracker thereby alerting the tracker to look for a laser signal, e.g. 10 pps targets, and provides a delay function to give the tracker time to settle into the boresight mode of operation. The autoboresight control signal to the tracker is required in that the tracker operates at a 30 pps frame rate. The autoboresight control signal insures that the tracker will lock onto, for example, a 10 pps target and not reject such signals as spurious. The control logic implementation for the accumulator when it is incorporated into the autoboresight system is described in full detail in said co-pending application.

On the other hand, when the accumulator is used as an error signal storage and accumulating device for a tracker system, a simple rememorization command can be generated by the tracker electronics at the conclusion of the error signal generating cycle to enable flip-flop 110 thereby initiating a counting cycle. However, flip-flop 110 or its equivalent is common to the control logic of all systems using the accumulator of the invention, and control signals functioning to SET flip-flop 110 to initiate a counting cycle must be provided. The frequency at which counting cycles occur depends, of course, upon the requirements of the system using the accumulator. Thus, it is to be understood that the invention is not limited to a particular form of control logic 100.

As shown in FIGS. 5 and 6, the accumulator may be provided with a limiter which functions to prevent the counter 86 from overflowing/underflowing. The limiter 87 includes threshold circuits which compare the stored signal to positive and negative reference signals. These reference signals represent the counter capacity. When the count in the counter reaches full count, the output from the digital to analog converter is a voltage slightly exceeding the reference voltage of like polarity. The limiter responds by generating a logic signal to disable the appropriate gates 80 or 82 preventing the counter 86 from any further counting.

FIG. 6 shows the limiter in detail. It is comprised of two analog comparator circuits 150 and 152. The positive input to comparator 150 receives a reference signal of positive polarity while the positive input to comparator 150 receives a reference signal of negative polarity. The negative inputs to both comparators are interconnected and further connected to line 60 whereby they receive the output from the digital to analog converter 88. As should now be evident, as the counters 122, 124 and 126 count, the signal on line 60 varies. This signal is compared in comparators 150 and 152 with the reference signals also applied to the comparators. When the signal on line 60 becomes more positive than the positive polarity reference signal to comparator 150, the output of this comparator goes to a logic low disabling gate 80 preventing the counters from incrementing any further. Since the reference signal supplied to comparator 150 is set to a level just less than the level corresponding to a full count in the counters, the counters are permitted to count up to a full count but prevented from overflowing. When the stored signal represents a negative polarity signal and the counters 122, 124 and 126 continue to decrement to develop a more negative signal on line 60, the comparator 152 compares these signals with the negative polarity reference voltage. Of course the comparator 150 also receives the negative polarity signal but in ineffective since the reference voltage will always be more positive than the signal on line 60 when that signal is of a negative polarity. The comparator 152 is at a logic low so long as the reference signal level is more negative than the level of the signal on line 60. Inverter 154 functions to invert the comparator 152 output thereby maintaining gate 82 enabled. As the signal on line 60 becomes more negative than the reference signal, which means that the positive input to comparator 152 is now positive with respect to the input to its negative terminal, the output from the comparator goes to a logic high which is converted to a logic low by the action of the inverter 154. This disables the gate 82 preventing counters 122, 124 and 126 from further decrementing.

What has been described is a unique and extremely useful digital accumulator which can accurately store signals over extended periods of time while allowing the stored signals upon command to be changed in response to changes in the accumulator input signal. The accumulator may be incorporated in any system where long-term hold and signal accumulation is desired. As explained hereinabove, the accumulator may be incorporated with an error signal-producing circuit forming a portion of a servo control system. Particularly, the servo control system may be part of a target tracker system. Another use of the accumulator is in an autoboresight system which functions to boresight a laser beam of a laser designator system to the null point of a TV tracker. These, of course, are not the only uses of the inventive accumulator and those skilled in the art can envision various other applications of the invention.

We claim:

1. A signal accumulator functioning to store a signal over an extended period of time, the stored signal representing the accumulated sum of values of an input signal as sampled over a plurality of processing cycles, comprising:
storage means for storing an electrical signal,
means for receiving an input signal,
summing means for producing the arithmetic sum of said stored electrical signal and said received input signal,
comparator means for comparing said stored signal with the sum signal output for said summing means, the output from said comparator means being indicative of the relative levels of the inputs thereto,
said signal storage means being interconnected with said summing means and said comparator means, with such interconnection representing a feedback arrangement for supplying said stored signal to said summing means and said comparator means, means, responsive to said comparator output, for modifying the stored electrical signal in accordance with the varying values of said sampled input signal, and control means for selectively enabling said stored signal modifying means during a processing cycle to modify the value of the stored signal in accordance with the value of the input signal during the processing cycle as compared to the value of signal stored in the storage means during a previous processing cycle.

2. The signal accumulator of claim 1 wherein said input signal receiving means is responsive to bipolar analog signals, said storage means comprises an up-/down digital counter, the output of said counter being connected to a digital to analog converter, the output of said converter being connected via said feedback arrangement to said summing means and said comparator means, said stored signal modifying means operating to cause the incrementing or decrementing of the counter stored signal in accordance with the relative amplitudes and polarities of the input analog signal and the stored signal.

3. The signal accumulator of claim 2 further including limiter means responsive to the count in said digital counter for selectively blocking further modification of said stored electrical signal during a processing cycle upon the occurrence of a full count in said digital counter.

4. The accumulator of claim 3 wherein said limiter is comprised of comparator means and reference signal means coupled to one input of said comparator means, another input of said comparator means being connected to the output of said digital to analog converter.

5. The accumulator of claim 2 further including filter means responsive to the output from said summing means for filtering said sum signal output and providing a short-term storage of said output, and switch means for selectively discharging the signal stored in said filter means.

6. The accumulator of claim 5 wherein said filter means is comprised of a resistance and a capacitance, and and wherein said switching means is a transistor switch selectively rendered conductive in response to said control means to discharge the signal stored in said filter means.

7. A digital accumulator for storing digital representations of a variable input analog signal comprising:

up/down counter means storing a digital representation of said input analog signal, said counter means including incrementing and decrementing inputs thereto, converter means for converting said digital representations to an analog equivalent signal, means for summing said analog equivalent signal with said analog input signal to produce a sum signal representing the arithmetic sum of said analog input signal and said analog equivalent signal, comparator means, responsive to said sum signal and said analog equivalent signal, for producing a logic level output representative of the relative amplitudes of the input signals to said comparator means, clock means for generating clocking signals, and gating means receiving said clocking signals and responsive to said comparator means for causing said counter means to increment the count stored therein when said sum signal is greater than said analog eqivalent signal and to decrement the count stored in said counter means when said sum signal is less than said analog equivalent signal.

8. The digital accumulator of claim 7 further including means for preventing said counter means from further counting when the logic level output from said comparator means changes from one logic level to another.

9. The digital accumulator of claim 8 further including limiter means for preventing said counter means from being incremented or decremented beyond its capacity, said limiter means comprising first and second threshold means, the positive input to said first threshold means receiving a positive reference voltage representing the maximum capacity of said counter in response to incrementing signals from said second threshold means receiving a negative reference voltage representing the maximum capacity of said counter in response to decrementing signals from said gating means, the negative input terminal of each of said threshold means receiving said analog equivalent signal.

10. The digital accumulator of claim 9 further including control logic responsive to control signals and comprising a flip-flop circuit and a coincidence gate, one input to which is connected to said clock means, the output from said flip-flop selectively enabling said coincidence gate to selectively transmit said clock signals to said gating means in response to control signals.

11. The digital accumulator of claim 10 wherein said gating means is comprised of a first and a second directional control gate, the output from the first directional control gate being connected to said incrementing input to said up/down counter means, the output from said second directional control gate being connected to the decrementing input to said up/down counter means, the inputs to each of said directional control gates being coupled to the output from said coincidence gate, an output from said limiter means, and an output from said comparator means, the outputs from said comparator means and said limiter means controlling the conductivity of said directional control gates to selectively pass said clock signals to either the incrementing or decrementing inputs to said up/down counter means.

12. The digital accumulator of claim 11 further including inverter means coupled between the output from said comparator means and an input to said second directional control gate, and wherein said means for preventing the counter means from further counting when the output from said comparator means changes from one logic level to another comprises first and second exclusive OR gates, a first input to said first exclusive OR gate being connected to the output from said comparator means, a first input in said second exclusive OR gate being connected to the output from said inverter means, the output from said second exclusive OR gate being connected to a second input to said first exclusive OR gate, the output from said first exclusive OR gate being connected to said flip-flop circuit to reset said flip-flop circuit when the logic level signal from said comparator means changes from one state to another.

* * * * *